United States Patent [19]
Bartelt et al.

[11] 3,770,433
[45] Nov. 6, 1973

[54] HIGH SENSITIVITY NEGATIVE ELECTRON RESIST

[75] Inventors: John Lester Bartelt, Summit; Eugene David Feit, Berkeley Heights, both of N.J.

[73] Assignee: Bell Telephone Laboratories, Incorporated, Murray Hill, N.J.

[22] Filed: Mar. 22, 1972

[21] Appl. No.: 237,048

[52] U.S. Cl. .......... 96/36, 96/35.1, 96/36.2, 96/36.3, 96/115 R

[51] Int. Cl. .......... G03c 5/00

[58] Field of Search .......... 96/115, 115 D, 35.1, 96/36, 36.3, 27, 36.2

[56] References Cited

UNITED STATES PATENTS

| | | | |
|---|---|---|---|
| 3,469,982 | 9/1969 | Celeste | 96/36.3 |
| 3,418,295 | 12/1968 | Schoenthaler | 96/115 R |
| 2,760,863 | 8/1956 | Plambeck | 96/115 R |
| 3,357,831 | 12/1967 | Wu | 96/35.1 |
| 3,575,925 | 4/1971 | Skoultchi | 96/35.1 |
| 3,702,812 | 11/1972 | McGinniss | 96/115 P |
| 2,747,103 | 5/1956 | Fairbank et al. | 96/76 R |
| 3,529,960 | 9/1970 | Sloan | 96/36 |
| 3,594,243 | 7/1971 | Deutsch et al. | 156/13 |

OTHER PUBLICATIONS

Thornley, R. F. M., et al., "Electron Beam Exposure of Photoresists", J. of Electrochemical Soc., Vol. 112, No. 11, pp. 1151–1153, Nov. 1965.

*Primary Examiner*—Norman G. Torchin
*Assistant Examiner*—Edward C. Kimlin
*Attorney*—W. L. Keefauver et al.

[57] ABSTRACT

A technique is described for the generation of a relief image in a sensitive negative electron resist based upon a modified polymer of glycidyl methacrylate alone or in combination with methyl methacrylate and/or ethyl acrylate. The described resist evidences optimum characteristics with respect to sensitivity, adhesion and resolution and is suitable for use as an etch mask in the fabrication of microelectronic devices.

6 Claims, No Drawings

HIGH SENSITIVITY NEGATIVE ELECTRON RESIST

This invention relates to a technique for the generation of a patterned relief image. More particularly, the present invention relates to the generation of a patterned relief image in a sensitive negative electron resist based upon a modified polymer of glycidyl methacrylate alone or in combination with methyl methacrylate and/or ethyl acrylate.

DESCRIPTION OF THE PRIOR ART

The current trend in semiconductor circuit manufacture is toward the attainment of the highest density of circuit functions per unit area of semiconductor. System reliability, speed and economic considerations are advantageously affected by this miniaturization. Although studies have continued, a further reduction in size beyond that attainable with the current technology is limited by the pattern definition afforded by photolithography. In the past decade, electron beams have been utilized with increasing frequency to expose resist materials in the fabrication of microelectronic devices and have successfully resulted in fine line patterns beyond the capabilities of conventional photolithography. Various photosensitive compositions comprising monomeric and crosslinkable polymeric compounds and elements embodying them are well known. For example, addition polymers of the type described in U. S. Pat. Nos. 3,418,295 and 3,469,982, issued on Sept. 30, 1969 and Dec. 24, 1968, respectively, have been used extensively to form relief images. Unfortunately, these photosensitive compositions were found to evidence limited sensitivity to electrons and unsatisfactory resolutions when exposed to electron beams, so causing workers in the art to focus their interest upon the development of novel resist compositions. Despite continuing efforts directed toward this end, electron resists have never been fully exploited and the ultimate goals of high sensitivity of the order of $10^6$ centimeters squared per coulomb and resolution of the order of 1 micron lines being spaced one-half micron apart, have been attained with limited success.

SUMMARY OF THE INVENTION

In accordance with the present invention a technique is described for the generation of a patterned relief image in a sensitive negative electron resist evidencing optimum characteristics with respect to adhesion and resolution. Briefly, the technique involves coating a substrate member with the reaction product of a polymer, formed by polymerizing methyl methacrylate, ethyl acrylate and glycidyl methacrylate, esterified with methacrylic acid, exposing the coating selectively to a source of electrons and washing away unexposed portions of the coating. The resultant developed relief image is eminently suited for use as an etch mask.

DETAILED DESCRIPTION OF THE INVENTION

A general outline of a method suitable for use in the generation of a relief image in accordance with the invention is set forth below. Certain operating parameters and ranges, as well as the type of materials employed, are indicated.

The described resist is based upon a polymer formed by reacting glycidyl methacrylate alone or in combination with methyl methacrylate and/or ethyl acrylate.

These materials are obtained from commercial sources and are employed in reagent grade form. Studies of resist characteristics have revealed that it is necessary in formulating the reaction mixture to include from 10 – 100 per cent by weight gylcidyl methacrylate, 0 – 60 per cent by weight ethyl acrylate and 0 – 30 per cent by weight methyl methacrylate and subsequently esterifying as described below. Deviations from the noted limits result either in the loss of dimensional stability or in the formation of a product having an unacceptable glass transition temperature.

In the preparation of the polymer, the acrylates in the required proportions and a suitable reaction initiator, such as benzoyl peroxide, are added incrementally to a suitable solvent, such as xylene, and the resultant mixture heated to a temperature within the range of 130° – 140°C for several hours. Then, the heated mixture is cooled to about 50°C and stabilization of the resultant polymer effected by addition of a radical scavenger such as hydroquinone.

The epoxy groups in the polymer which are provided by the gylcidyl methacrylate are then partially esterified with methacrylic acid to corresponding vinyl groups and it is this conversion which results in the sensitivity and adhesion required for device fabrication. In order to attain the prescribed resist characteristics, it is necessary to esterify at least 5 per cent by weight of the prepolymer with methacrylic acid. The polymer obtained following this treatment is then fractionated by solvent precipitation before use to eliminate low molecular weight material and to provide additional purification. The fractionated polymer is next dissolved in a suitable solvent such as xylene to yield a 2 – 4 per cent solution which is then coated upon a suitable substrate member by conventional spin coating techniques. Final film thickness desirably ranges from 3,500 to 6,000 A. Although the resolution is enhanced by utilizing a thin film, the incidence of pinholes dictates a practical minimum of 3,500 A. At this stage in the processing, a prebaking step is advantageously employed for the purpose of removing excess solvent and to anneal strain in the coated film. A suitable program designed to attain this end would involve heating at a temperature within the range of 105° – 115°C for a time period ranging from 10 – 15 minutes.

Thereafter, the coating is exposed to an electron beam source having an accelerating voltage within the range of 3 to 20 kilovolts at a dosage greater than $2 \times 10^{-7}$ coulombs/cm². The noted voltages and dosage are dictated by considerations relating to resolution and material limitations, respectively. The next stage in the process involves developing the exposed coating. Development may be effected by utilizing a combination of a solvent and a nonsolvent. Solvents found useful for this purpose include ketones, aromatic hydrocarbons and chlorinated hydrocarbons. Non-solvents suitable for this purpose include the conventional alcohols. The development procedure conveniently involves soaking or spraying the exposed film with a solvent for a time period from 10 to 90 seconds and subsequently spraying or immersing the partially developed material in an alcohol for a timer period ranging from 0 to 30 seconds. After development, a postbaking treatment for 10 – 20 minutes at a temperature ranging from 110° – 120°C may be employed for the purpose of evaporating the developers and enhancing adhesion characteristics.

An example of the present invention is described in detail below. This example is included merely to aid in the understanding of the invention and variations may be made by one skilled in the art without departing from the spirit and scope of the invention.

EXAMPLE 1.00 gram of benzoyl peroxide was dissolved in a mixture comprising 26.0 grams of methyl methacrylate, 50.0 grams of ethyl acrylate and 23.7 grams of glycidyl methacrylate. The resultant mixture was added over a three hour period with stirring to 250 milliliters of xylene in a nitrogen atmosphere. The mixture was refluxed for an additional 3 hours, cooled to 50°C and stabilized with 0.0203 gram of hydroquinone. Next, 14.7 grams of methacrylic acid were added to the cooled mixture and approximately 70 per cent of the glycidyl groups were converted to vinyl groups by heating to 138°C for 1.5 hours. The resultant polymer solution was then diluted to about 2 per cent solids with xylene and purified by precipitation in an ice cooled 10:2:1 mixture of petroleum ether isopropanol and water. The purified polymer was then dissolved in xylene to yield a 2 per cent solution. Then, a resist film, 3,500 A in thickness was prepared upon a silicon wafer bearing a 2,000 A thick silicon dioxide coating by spin coating at 3,000 r.p.m. employing a commercial high acceleration spinner. After coating, the wafer was prebaked for 10 minutes at 105°C in a vacuum oven to remove excess solvent and to anneal strain in the film. Following, the wafer was exposed with a programmed electron beam with a dose of approximately $2 \times 10^{-7}$ coulombs per square centimeter at an accelerating voltage of 5 kilovolts. Development of the exposed film was then effected by spraying sequentially with methyl ethyl ketone for 7.5 seconds, a 1:1 solution of methyl ethyl ketone and isopropanol for 20 seconds and 15 seconds with isopropanol and finally blowndry with nitrogen for 30 seconds. Lastly, the wafer was postbaked for 10 minutes at 110°C.

In order to determine the efficacy of the resultant developed resist, the silicon dioxide was etched in an ammonium fluoride buffered hydrofluoric acid solution for 2 minutes. The finest oxide lines obtained were approximately 5,000 A wide.

What is claimed is:

1. The method of forming a patterned relief image on the surface of a substrate comprising exposing a portion of a polymer film comprising the reaction product of a prepolymer with methacrylic acid, said prepolymer comprising from 10 – 100 percent by weight glycidyl methacrylate, 0 – 60 percent by weight ethyl acrylate, and 0 – 30 percent by weight methyl methacrylate, to a patterned source of electrons, thereby resulting in the insolublization of the exposed portion of said coating relative to the unexposed portion and selectively removing the unexposed portion from said substrate.

2. Technique in accordance with claim 1 wherein at least 5 per cent by weight of the prepolymer is esterified with methacrylic acid.

3. Technique in accordance with claim 1 wherein the thickness of said coating ranges from 2,000 to 5,000 A.

4. Technique in accordance with claim 1 wherein said developing solution comprises a solvent selected from the group consisting of ketones, chlorinated hydrocarbons and aromatic hydrocarbons.

5. Technique in accordance with claim 4 wherein said developer further includes an alcohol.

6. Technique in accordance with claim 1 wherein said coating is exposed to a patterned source of electrons at an accelerating voltage within the range of from 3 to 20 kilovolts at a dosage greater than $2 \times 10^{-7}$ coulombs per $cm^2$.

* * * * *